(12) United States Patent
Mikol

(10) Patent No.: US 7,359,260 B2
(45) Date of Patent: Apr. 15, 2008

(54) REPAIR OF MEMORY CELLS

(75) Inventor: Gregory P. Mikol, Vancouver, WA (US)

(73) Assignee: Analog Devices, Inc., Norwood, MA (US)

( * ) Notice: Subject to any disclaimer, the term of this patent is extended or adjusted under 35 U.S.C. 154(b) by 183 days.

(21) Appl. No.: 11/128,697

(22) Filed: May 12, 2005

(65) Prior Publication Data

US 2005/0259486 A1 Nov. 24, 2005

Related U.S. Application Data

(60) Provisional application No. 60/573,093, filed on May 20, 2004.

(51) Int. Cl.
*G11C 29/00* (2006.01)
*G11C 7/00* (2006.01)

(52) U.S. Cl. .................. 365/200; 365/201; 365/230.03

(58) Field of Classification Search ................ 365/200, 365/201, 230.03
See application file for complete search history.

(56) References Cited

U.S. PATENT DOCUMENTS

| | | | |
|---|---|---|---|
| 5,673,227 A | 9/1997 | Engles et al. | |
| 5,926,421 A * | 7/1999 | Choi | 365/200 |
| 5,953,745 A | 9/1999 | Lattimore et al. | |
| 6,144,593 A | 11/2000 | Cowles et al. | |
| 6,449,199 B2 * | 9/2002 | Hidaka | 365/200 |
| 6,567,322 B1 * | 5/2003 | Mukai et al. | 365/200 |
| 6,625,072 B2 * | 9/2003 | Ohtani et al. | 365/200 |
| 6,882,592 B2 * | 4/2005 | Noguchi et al. | 365/230.03 |
| 2002/0024859 A1* | 2/2002 | Ooishi | 365/200 |
| 2002/0181303 A1* | 12/2002 | Kato et al. | 365/200 |
| 2004/0022110 A1* | 2/2004 | Haraguchi et al. | 365/222 |

* cited by examiner

*Primary Examiner*—Anh Phung
*Assistant Examiner*—Toan Le
(74) *Attorney, Agent, or Firm*—Marger Johnson & McCollom, PC

(57) ABSTRACT

A memory device has at least one sub array of memory cells having data columns and at least one spare sub array having spare columns. In one embodiment the sub array of memory cells and the sub array having spare columns are the same sub array. Individual elements in the sub arrays of memory cells can be repaired using an individual element from the spare sub array.

16 Claims, 7 Drawing Sheets

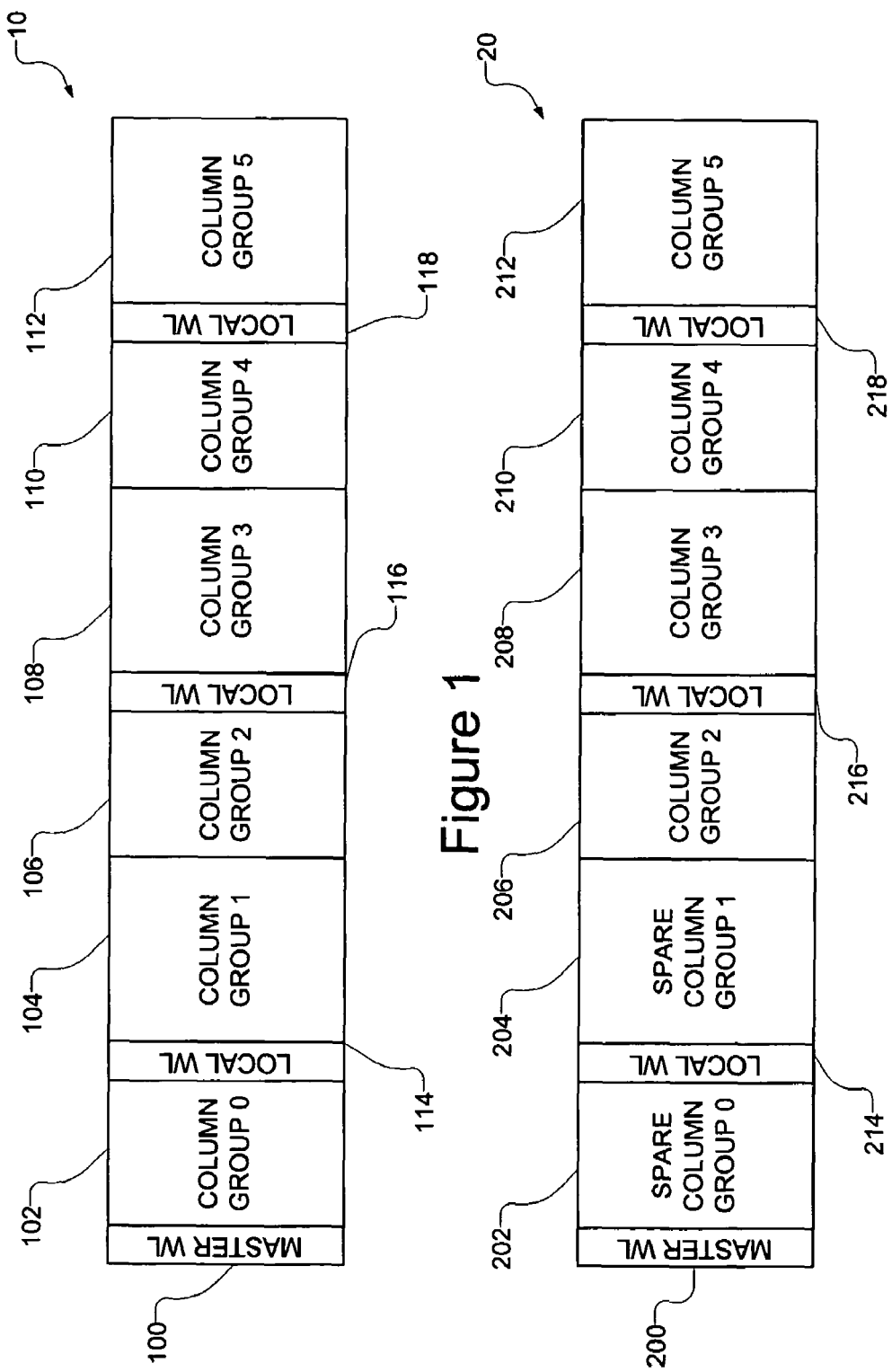

ized into 2 16-bit spare column
REPAIR OF MEMORY CELLS

This application claims priority from U.S. Provisional Application Ser. No. 60/573,093 filed May 20, 2004.

BACKGROUND

Memory manufacturers may provide redundant memory structures on a memory module. When the memory is tested, after manufacture and prior to shipment, the redundant structures can be used to repair the memory cell array, allowing an otherwise defective part to be correct and used. This increases manufacture yield and decreases costs.

In a previous implementation of a memory cell array, an entire data byte, 8 bits, or word, 16 bits, was read out from a single column of physically adjacent bit cells. A single column consisted of n bitline pairs that would produce n data bits when accessed. Repair of defects in this type of array generally involved replacing a column having a defect with a spare column having the same number of bitline pairs as the column with the defect. All data bits in the column containing the defect were replaced in this scheme. A group of 32 spare bitlines, organized into 2 16-bit spare column elements, could be used to repair up to 2 column defects.

In newer memory implementations, each group of n bitlines produces a single data bit output, depending upon a column multiplexer ratio. For example, a group of 8 physically adjacent bitline pairs would produce one data bit, assuming the column multiplexer ratio was 8:1. The next set of 8 adjacent bitline pairs would produce the next data bit. Defects in memory arrays have a very random nature, and it would be desirable to provide each data bit with 2 possible repair elements, equivalent to the previous scheme. However in order to do so would require 256 spare bitline pairs, 8*16*2. This increases the array overhead 8 times for redundancy.

SUMMARY

One embodiment is a memory device having at least one sub array of memory cells with data columns and at least one spare sub array having spare columns. Individual elements in the sub arrays of memory cells can be repaired using an individual element from the spare sub array.

In one embodiment the sub array of memory cells and the sub array having spare columns are the same sub array.

In one embodiment, a system includes a processor for accessing the memory device, the memory device having at least one sub array with data columns and at least one spare sub array having spare columns.

BRIEF DESCRIPTION OF THE DRAWINGS

Embodiments of the invention may be best understood by reading the disclosure with reference to the drawings, wherein:

FIG. 1 shows a standard memory cell array without any redundancy.

FIG. 2 shows a memory cell array having redundancy.

DETAILED DESCRIPTION OF THE EMBODIMENTS

Figure 3:
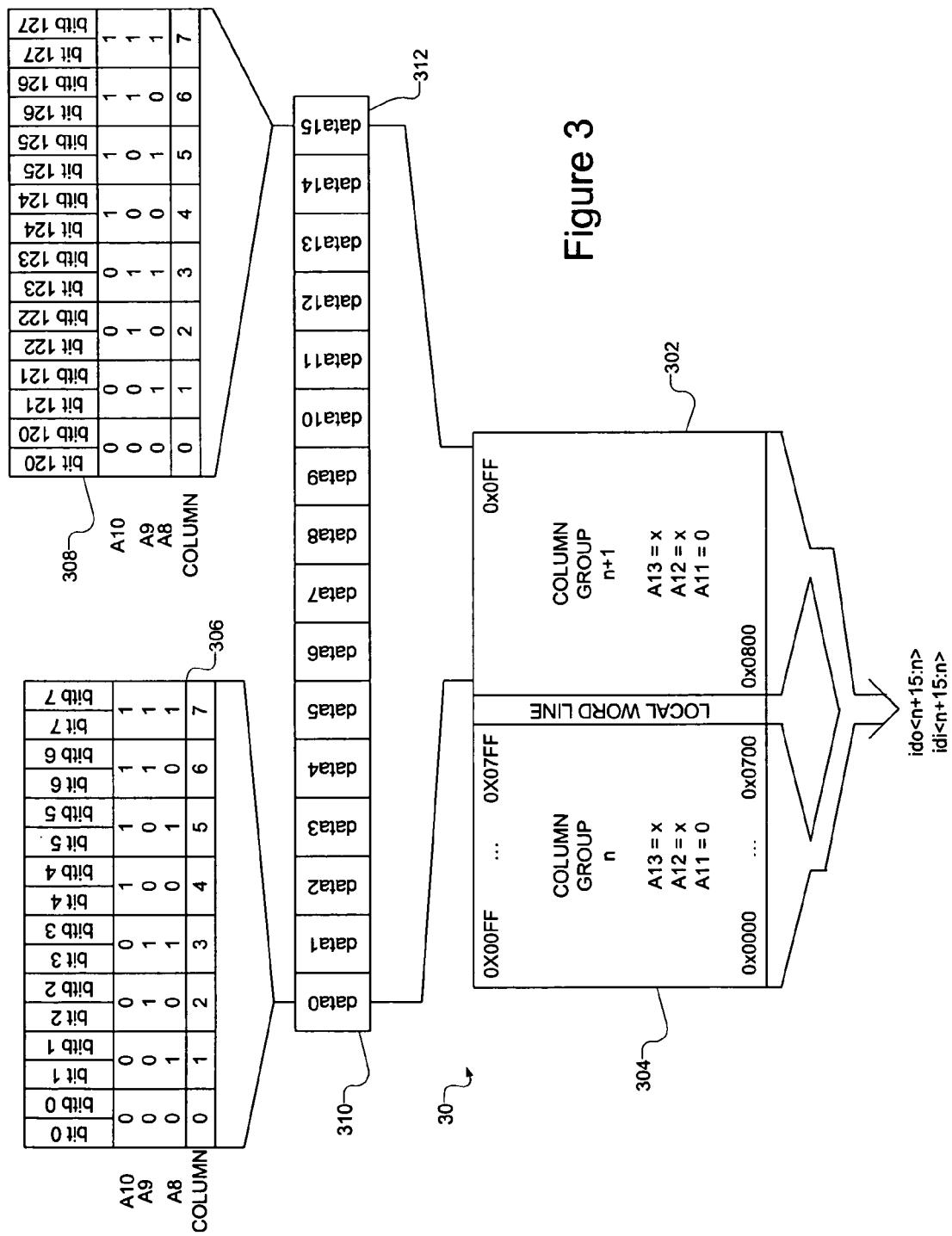
FIG. 3 shows data mapping for a memory cell sub array.

FIG. 1 shows an embodiment of a memory array 10 having 6 sub arrays without repair. The memory cell array 10 has a master wordline 100, and six sub arrays, 102, 104, 106, 108, 110 and 112. The sub arrays are addressed by local wordlines 114, 116 and 118. There are no spares to allow repair of defective columns, which is why it is referred to as 'without repair.'

In contrast, FIG. 2 shows an embodiment of a memory array 20 having 4 sub arrays 206, 208, 210 and 212 and 2 sub arrays with spare columns 202 and 204. This is a memory of identical logical size to the embodiment in FIG. 1, but with repair. The sub arrays with spare columns 202 and 204 will be referred to here as the spare sub arrays. The memory cell array has a master wordline 200 and local wordlines 214, 216 and 218, similar to FIG. 1.

There is no requirement that there be a certain number of memory sub arrays or spare sub arrays, the example of FIG. 2 is just intended as an example. Further, the memory sub arrays could be any type of random access memory (RAM), including dynamic RAM (DRAM), or static RAM (SRAM). Additionally, the location of the spare sub array pair is not limited to any particular example given here.

FIG. 3 shows an embodiment of the data mapping for one half of a memory array 30 without repair. As described here, the sub arrays are arranged in a pair of 16-bit sub arrays 302 and 304. At the top of the diagram, the values of the address bits A8, A9 and A10 are given to address a particular data column 0-7. For bits 0-7 and the inverse, bit bar or bitb, the values in table 306 are for data column 0. For bits 120-127 and their inverses the values in table 308 are for data column 15. For example, data column 0 is addressed with the address bits A8-A10 being 000, and the state of data0 is determined by bit0 and bitb0. This is similar for both halves of the pair.

As discussed above, the examples given herein are not limited to particular widths or sizes of arrays or subarrays. For example, the embodiment of the data mapping of FIG. 3 could be adapted to use 4 columns, 8 columns, 32 columns, etc., with the data column and addressing bits adjusting as needed.

Figure 4:
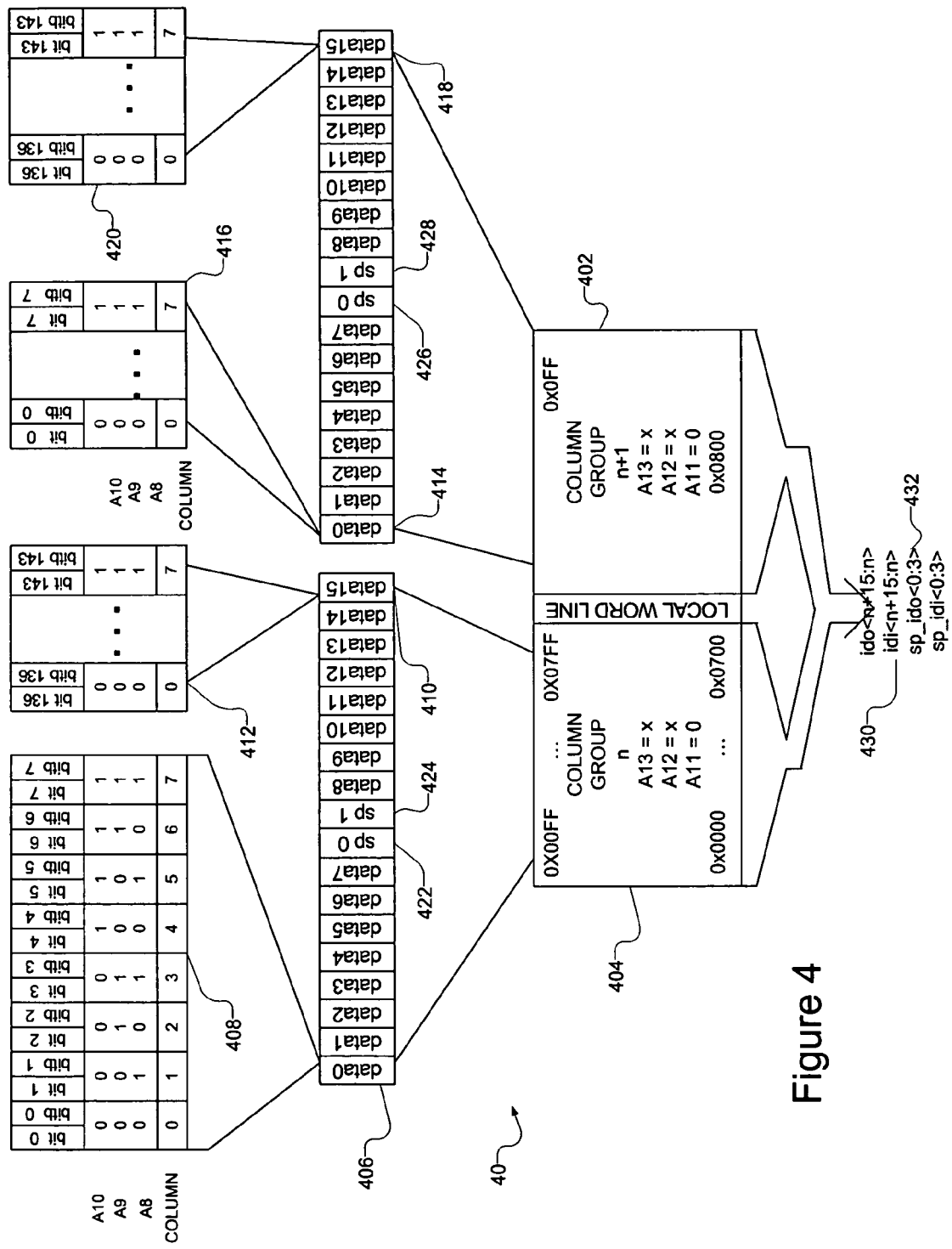
FIG. 4 shows data mapping for a spare memory cell sub array.

In contrast, the data mapping for a sub array having redundancy available for repair is shown in FIG. 4. The memory array 40 is again divided into two, 16-bit pairs 402 and 404. Each data column such as 406 has a mapping shown in table 408, with the mapping for data column 15 shown in table 412. For the second half of the array 402, data column 0 414 has the mapping shown in table 416 and data column 15 418 has the mapping shown in table 420.

The mapping of the individual 'normal' data columns remains the same as the previous, but there are 2 added data columns spare 0 (SP0) and spare 1 (SP1) in each half, such as spare columns 422 and 424 in the first half 402 and spare columns 426 and 428 in the second half 402. These are used as replacements for the columns having the defects. It must be noted that although the location of the spare registers is shown to be in the center, the location of these may be anywhere.

The output of each data bit column is produced by a sense amplifier, which outputs a signal during a read operation to an internal data out bus, ido<n> 430. The write circuitry takes data from an internal data in bus, idi<n> 432, and writes to the selected cell location during a write operation. The input and output signals from the sense amplifiers associated with the spare column elements are designated here as sp_idi<0:3> and sp_ido<0:3>. For ease of discussion, the scope will be limited to the internal data out busses, as the internal data in busses are operated in a similar fashion.

Figure 5:
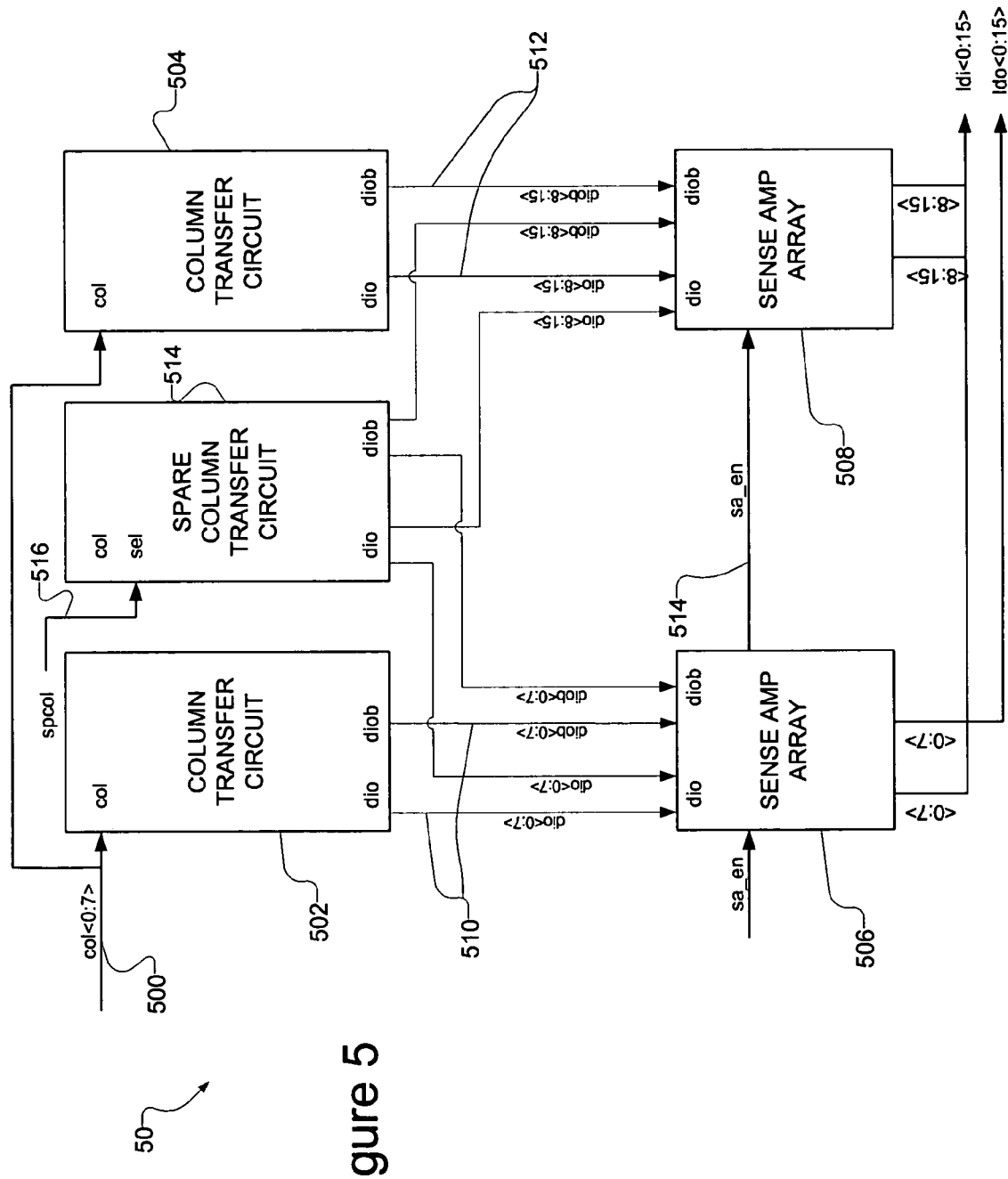
FIG. 5 shows a previous embodiment of a memory cell array with redundancy.

Referring to FIG. 5, an implementation of a conventional column replacement scheme is shown in memory architecture 50. The column signal col<0:7> 500 input to the column transfer circuits 502 and 504 selects the desired columns of data to be output. The output of the column transfer circuits 502 and 504 to the sense amp arrays 506 and 508 are bussed across local bidirectional data busses, dio and diob, 510 and 512. The output of the spare column transfer circuit 514 would also use that bus, but only if the spcol signal 516 enabled the spare column output.

If one of the data columns were determined to have a defect, the signal spcol 516 would activate one of the columns in the spare column transfer circuit 514 to replace the entire column having the defect. The activation generally involves blowing a number of repair fuses for each spare column element and 1 or more fuses to disable the defective column. In the conventional column replacement scheme, such as the one shown in FIG. 5, the fuses would only define the address of the failing column and would enable the spare column element to replace the entire column.

Figure 6:
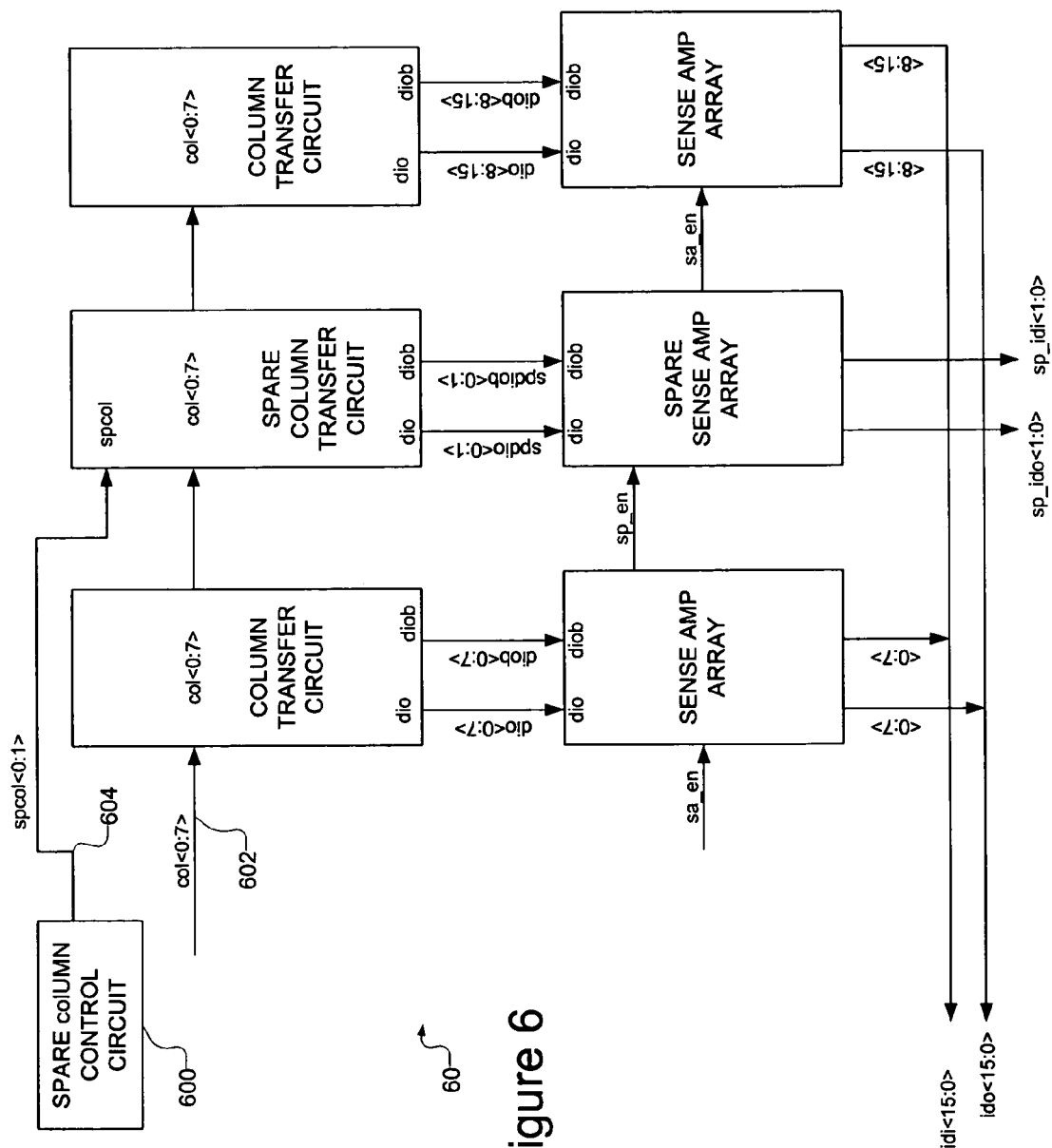
FIG. 6 shows an embodiment of a memory cell array with redundancy.

"In the embodiments of the present invention, additional fuses would be blown to select which data bit the spare element is being assigned to replace. The circuit 60 of FIG. 6 includes a spare colunm control circuit 600 that provides a signal spcol<0:1>604 to select which element. A separate sense amp enable signal, sp$_{13}$en, is used to activate the spare sense amps. This saves power when the spare sense amps are not being used."

The substitution of the spare element for the defective element occurs in the data out buffer, without regard to the column selection signal 604. This is different than the current solutions, in which the defective column was disabled, and the dio and diob outputs from the spare element went through the regular sense amps and into the dout path.

Figure 7:
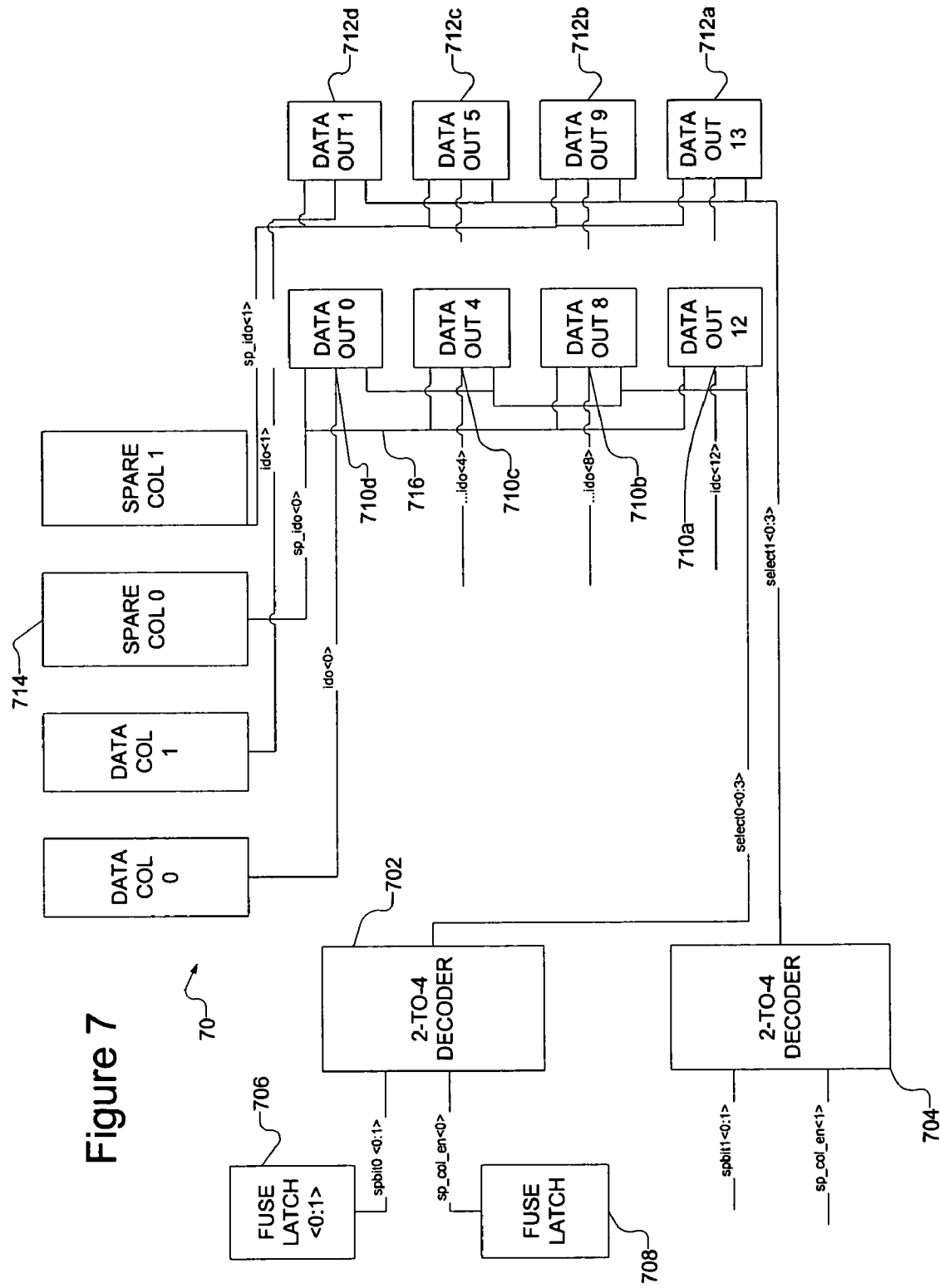
FIG. 7 shows an embodiment of a control portion of a memory cell array with redundancy.

A circuit for controlling the data on the idi and ido busses is shown in FIG. 7. In the above examples, there are actually 16 data bits, and 4 sets of select signals. There are 4 2-to-4 decoders. Only half of these are shown here as decoders 702 and 704 to simplify the drawings. The fuse latches 706 and 708 provide data from the blown fuses selected by the repair. This data is provided to a 2-to-4 decoder 702 as spbitn<0:1> and sp_col_en<0> and the resulting select signals are sent to the data out buffers 710a-710d. Similar signals are provided to a second decoder 704 such that 2 4-bit select signals are generated and provided to the data out buffers 712a-712d. The data columns, such as data column 0, provide the data bit and the spare columns provide the data bit for whichever spare column is activated. The select signal, and the spare column and data column signals, are all provided to the data buffers that then provide the output data.

In this particular example, there is a 16-bit wide data word, with 4 spare column elements available. Each spare column element can repair one of four data bits, and 2 bit-select fuses are needed to select 1 of the 4 choices.

Defects in the memory array may be wholly contained within a single data bit column, or may encompass 2 columns, such as a metal short between the last bitline pair of a first group and the first bitline pair of the next group. A simple mapping of each spare column element to a block of data bits cannot repair this second type of defect. For example, mapping spare element 0 to data bits 0-3, spare element 1 to data bits 4-7, etc. cannot repair a short between the columns of data bits 2 and 3, since 2 spare elements are needed to repair 2 columns and only 1 element maps to those bits.

The mapping of each spare column element to the data bits which it is capable of repairing is chosen such that no physically adjacent columns are mapped to the same spare column element in order to provide maximum coverage for both single-bit and multi-bit defects. Mapping schemes of this type will be referred to as 'distributed' mapping. One example of this type of assignment is the use of element n to repair data bits n, n+m, n+2m, etc., where m is the number of spare elements available. The mapping in this example is as follows:

Spare column element 0 can repair data bits 0, 4, 8 and 12.
Spare column element 1 can repair data bits 1, 5, 9 and 13.
Spare column element 2 can repair data bits 2, 6, 10 and 14.
Spare column element 3 can repair data bits 3, 7, 11 and 15.

In some instances, 4 column defects can be repaired, an improvement over the prior scheme. Defects occurring between 2 adjacent data bits could have as many as 2 different defects repaired. A limitation lies in the use of 2 independent spare elements. For example, a short between data 0 and data 1 and a short between data 10 and data 11 can be fixed, using all 4 spare elements. A short between data 0 and data 1 and a short between data 9 and data 10 cannot both be fixed, as it would require using a spare element twice, the spare element for either data 1 or data 9.

In some instances, only 1 defect can be repaired. For example, a defect in data 0 can be repaired, while a defect in data 0 and data 12 cannot be repaired because spare element 0 can only be used once. Similarly, a defect in data 0 in 2 different sub arrays cannot be fixed. Of course, these examples are for a 16-bit wide word with 4 spare elements. Other combinations of bit widths and spare elements are possible and these are only intended as examples. It must be noted that the spare sub array selectively repairs bit subsets of a data word, such as 2 bits out of a 16-bit data word, not the entire word. The bit subset is smaller than the data word.

Figure 8:
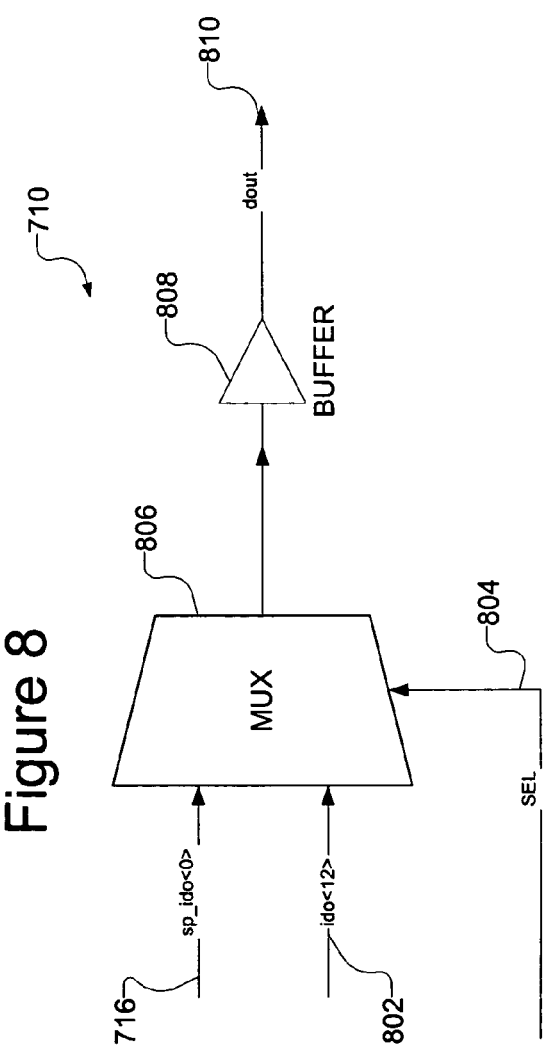
FIG. 8 shows an embodiment of a data out buffer.

FIG. 8 shows an example of the output buffer DATA OUT 12. The spare internal data out bit 0 716 from the spare column 0 714 from FIG. 7, and the internal data out bit 12 804 are provided to the multiplexer 806. The select signal, generated from the 2-to-4 decoder 702 and the fuses 706 and 708 from FIG. 7, determines which of the spare data out bit 716 and the internal data out bit 804 is sent to the buffer 808 and ultimately output as data out 810. In this manner, the 'bad' data from the failed element providing the data out bit 12 802 may be replaced with the 'good' data from the replacement element providing the spare data out bit 0 716. This avoids replacing the entire column, while also making more spare elements available for repair.

It must be noted that, as shown above the spare elements are shown in their own sub array and the memory cells are in their own sub arrays. This is only for ease of discussion. Referring back to FIG. 20, the entire memory could be comprised of one sub array, such as 202, that has both data columns of memory cells, and spare columns of spare cells. This may be referred to as a sub array of memory cells, and a sub array of spare columns, where the sub arrays are the same sub array. In any embodiment, spare cells from the spare columns are used to repair memory cells in the data columns at the individual cell level.

Figure 9:
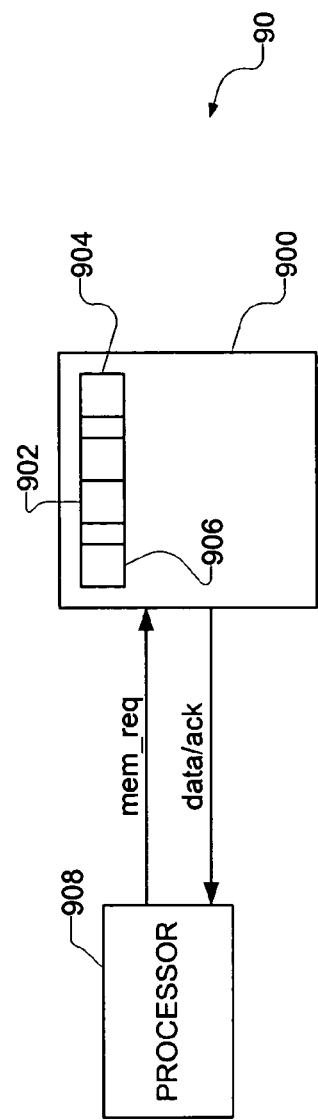
FIG. 9 shows an embodiment of a host system using a memory array with repair.

Having seen how a memory can be repaired at the individual element level, using a spare sub array, it is now possible to see how the memory with repair is used in a system. FIG. 9 shows an embodiment of a memory with repair and a processor to access the memory. The memory array 900 will typically comprise at least two sub arrays 902 and 904 and spare sub array 906. After the memory has been manufactured, it is tested and any defective cells are identified.

The necessary fuses, as shown for example in FIG. 7, are then blown to allow the individual elements in the defective columns of sub arrays 902 and 904 to be repaired by substituting use of the elements in the spare sub array 906. From the processor view point, the processor 908 sends a memory request, either a read or a write, and the control circuitry of the memory array 900 makes the correction to use the repair cells. The memory repair is transparent to the processor 908. The memory sends the requested data or a write acknowledgement back to the processor with no indication of the repair.

Thus, although there has been described to this point a particular embodiment for a method and apparatus for memory repair, it is not intended that such specific references be considered as limitations upon the scope of this invention.

What is claimed is:

1. A memory device, comprising:
   at least one sub array of memory cells having data columns;
   at least one spare sub array having spare columns consisting of individual elements, such that individual data bits from individual elements in the columns can be repaired using an individual element from the spare column.

2. The memory device of claim 1, the at least one sub array of memory cells and the at least one sub array of spare columns being the same sub array.

3. The memory device of claim 1, the one spare sub array further comprising a spare sub array such that individual elements from the spare columns of the spare sub array selectively repair a subset of bits within a data word, wherein the subset of bits is smaller than a complete word.

4. The memory device of claim 1, further comprising a column transfer circuit corresponding to the data columns in the sub arrays of memory cells.

5. The memory device of claim 1, further comprising a spare column transfer circuit corresponding to the spare columns in the spare sub array.

6. The memory device of claim 1, further comprising sense amplifier arrays corresponding to the sub arrays of memory cells to sense the data state of the memory cells.

7. The memory device of claim 1, further comprising a spare sense amplifier array corresponding to the spare sub array to sense the data state of spare memory cells in the spare sub array.

8. The memory device of claim 1, further comprising control circuitry to control data on internal busses in the memory device.

9. The memory device of claim 8, the control circuitry further comprising at least one fuse latch to store data regarding fuses blown in the spare sub array.

10. The memory device of claim 8, the control circuitry further comprising at least one decoder to provide selection signals to select between the data columns and the spare columns.

11. The memory device of claim 10, the selection signals to select a spare column using distributed mapping.

12. The memory device of claim 1, the spare subarray having m spare elements, such that a spare element n is capable of repairing bits at locations n and multiples of m added to n.

13. A system, comprising:
   a processor; and
   a memory array having at least one sub array of memory cells having data columns and at least one spare sub array having spare columns, such that individual elements of the spare columns can be used to repair individual data bits from defective cells in the data columns.

14. The system of claim 13, the memory array further comprising one sub array having both data columns and spare columns.

15. The system of claim 13, the spare sub array to selectively repair bit subsets of a data word, wherein a bit subset is smaller than the data word.

16. The system of claim 13, the memory array further comprising four sub arrays and two spare sub arrays.

* * * * *

UNITED STATES PATENT AND TRADEMARK OFFICE
CERTIFICATE OF CORRECTION

| | |
|---|---|
| PATENT NO. | : 7,359,260 B2 |
| APPLICATION NO. | : 11/128697 |
| DATED | : April 15, 2006 |
| INVENTOR(S) | : Gregory P. Mikol |

Page 1 of 1

It is certified that error appears in the above-identified patent and that said Letters Patent is hereby corrected as shown below:

Column 1, line 30, the word "8" should read -- 8 physically --;

Column 3, line 32, the word ""In" should read -- In --;

Column 3, line 35, the word "colunm" should read -- column --;

Column 3, line 37, the word "sp$_{13}$en" should read -- sp_en --;

Column 3, line 39, the word "used."" should read -- used. --.

Signed and Sealed this

Eighth Day of September, 2009

David J. Kappos
*Director of the United States Patent and Trademark Office*